(12) United States Patent
Amrie Bin Shaari et al.

(10) Patent No.: US 11,367,495 B2
(45) Date of Patent: Jun. 21, 2022

(54) MICROELECTRONIC DEVICE TESTING, AND ASSOCIATED METHODS, DEVICES, AND SYSTEMS

(71) Applicant: Micron Technology, Inc., Boise, ID (US)

(72) Inventors: Ahmad Zainal Amrie Bin Shaari, Tokyo (JP); Hideyuki Ichida, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 325 days.

(21) Appl. No.: 16/782,949

(22) Filed: Feb. 5, 2020

(65) Prior Publication Data
US 2021/0241842 A1  Aug. 5, 2021

(51) Int. Cl.
*G11C 29/18* (2006.01)
*G11C 8/08* (2006.01)
*G11C 29/00* (2006.01)

(52) U.S. Cl.
CPC ............. *G11C 29/18* (2013.01); *G11C 8/08* (2013.01); *G11C 29/802* (2013.01)

(58) Field of Classification Search
CPC .......... G11C 29/18; G11C 29/802; G11C 8/08

USPC ........................................................ 714/6.1
See application file for complete search history.

(56) References Cited

U.S. PATENT DOCUMENTS

| 8,885,425 | B2 * | 11/2014 | Takagiwa | G11C 29/04 365/185.09 |
| 8,966,329 | B2 * | 2/2015 | Clark | G11C 29/28 714/721 |
| 10,937,517 | B1 * | 3/2021 | Rich-Plotkin | G11C 29/028 |

* cited by examiner

*Primary Examiner* — Son L Mai
(74) *Attorney, Agent, or Firm* — TraskBritt

(57) ABSTRACT

Memory devices are disclosed. A memory device may include a memory array including a number of column planes and at least one circuit coupled to the memory array. The at least one circuit may generate test result data for a column address for each column plane of the number of column planes. The at least one circuit may further convert the test result data to a first result responsive to two or more of the column planes failing the test. The at least one circuit may also convert the test result data to a second result responsive to no column planes failing the test. Further, the at least one circuit may convert the test result data to a third result responsive to one column plane failing the test. The third result may identify the one column plane. Methods of testing a memory device, and electronic systems are also disclosed.

20 Claims, 11 Drawing Sheets

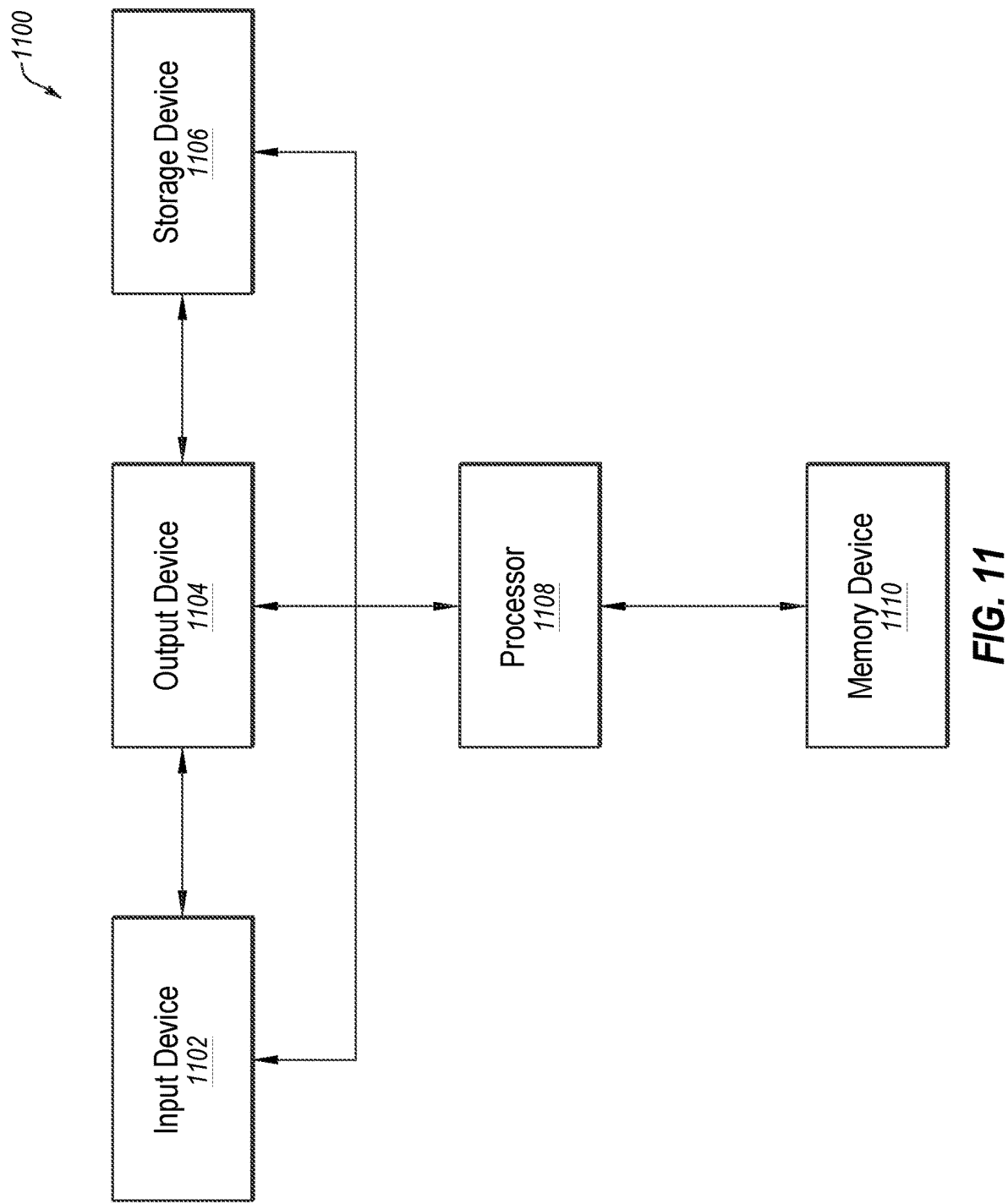

MICROELECTRONIC DEVICE TESTING, AND ASSOCIATED METHODS, DEVICES, AND SYSTEMS

TECHNICAL FIELD

Embodiments of the disclosure relate generally to microelectronic devices More specifically, various embodiments relate to microelectronic device testing including data encoding, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Memory devices typically include many memory cells that are capable of holding a charge that is representative of a bit of data. Typically, these memory cells are arranged in a memory array. Data may be written to or retrieved from a memory cell by selectively activating the memory cell via an associated word line driver.

BRIEF DESCRIPTION OF THE DRAWINGS

FIG. 11 is a simplified block diagram of an electronic system, in accordance with various embodiments of the present disclosure.

DETAILED DESCRIPTION

A semiconductor memory device typically includes an array of memory cells. Memory cells in the array are selected for reading and writing by means of row and column address signals input to the memory device. The row and column address signals are processed by address decoding circuitry to select row lines and column lines in the array to access the desired memory cell or memory cells.

When semiconductor devices are manufactured, defective memory cells may occur in the memory array or in a sub-array. To salvage the semiconductor memory device despite these defective memory cells, and thus to increase overall yield in the manufacturing process, redundancy is commonly implemented. Redundant memory cells are located in the memory array and the memory array may be associated with a number of redundant memory cells. When a defective memory cell is detected in the array, redundant decoding circuitry associated with the redundant memory cells may be programmed (e.g., via fuse, antifuse, or other programming techniques) to respond to the address of the defective memory cell. When the address of the defective memory cell is selected for access, the redundant memory cell may be accessed (e.g., read from or written to) rather than the defective memory cell.

As described more fully below, various embodiments disclosed herein relate to microelectronic device testing, including encoding test data. More specifically, various embodiments relate to testing a memory device, identifying defective column planes of a memory device, if any, encoding test data, and possibly identifying memory device failures (e.g., if more than one column plane fails for a specific column plane address). Compared to conventional devices, various embodiments may reduce an amount of data transferred to testing circuits (e.g., either within a memory device or external to the memory device) to identify which one or more column planes of a memory device are defective, if any.

Although various embodiments are described herein with reference to memory devices, the present disclosure is not so limited, and the embodiments may be generally applicable to microelectronic devices that may or may not include semiconductor devices and/or memory devices. Embodiments of the present disclosure will now be explained with reference to the accompanying drawings.

Figure 1:
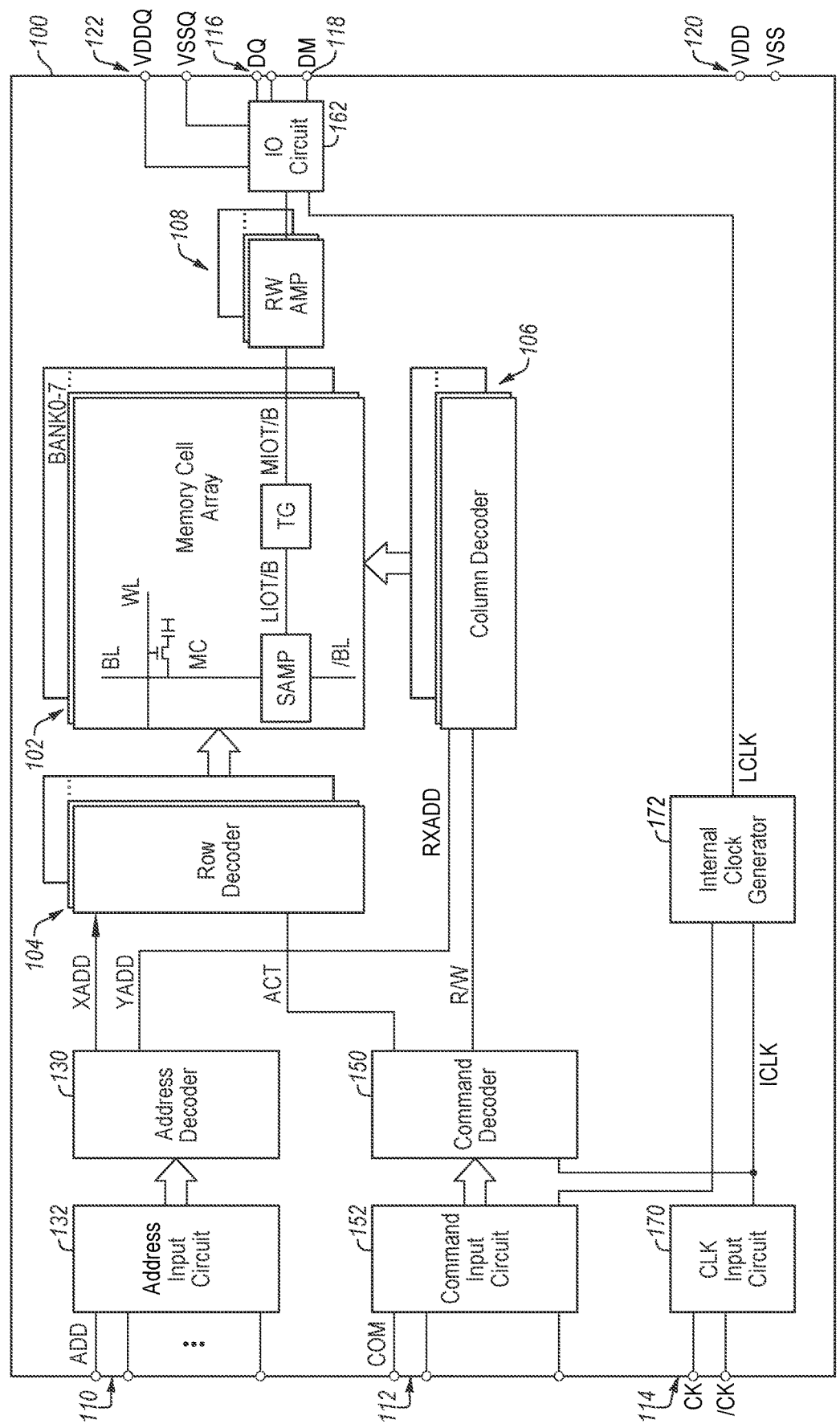
FIG. 1 is a block diagram of an example memory device, in accordance with at least one embodiment of the present disclosure.

FIG. 1 includes a block diagram of an example memory device 100, according to various embodiments of the present disclosure. Memory device 100, which is and may be referred to herein as a memory device, may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 108 over complementary local data lines (LIOT/B), transfer gate (TG), and complementary main data lines (MIOT/B). Conversely, write data outputted from read/write amplifiers 108 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 108, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 108, transfer gate TG, and sense amplifier SAMP. The write data may be written to memory cell MC specified by row address XADD and column address YADD.

Clock signals CK and /CK may be received via clock terminals 114. A clock input circuit 170 may generate internal clock signals ICLK based on clock signals CK and ICK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

According to various embodiments, input/output circuit 162 may include, or may be coupled to one or more encoders, which, as described more fully below, may be configured to receive test data from memory cell array 102 and, in response thereto, generate one or more signals (e.g., encoded signals) indicative of whether or not one or more column planes are defective and/or an address of a defective column plane.

As will be appreciated by a person having ordinary skill in the art, a "memory mat" generally refers to a subunit of a memory bank having a plurality of memory cells. Each memory mat is defined as a range in which a word line WL and a bit line BL extend. A memory mat may include two or more sub-mats. A sub-mat may also be referred to herein as a "column plane."

Figure 2:
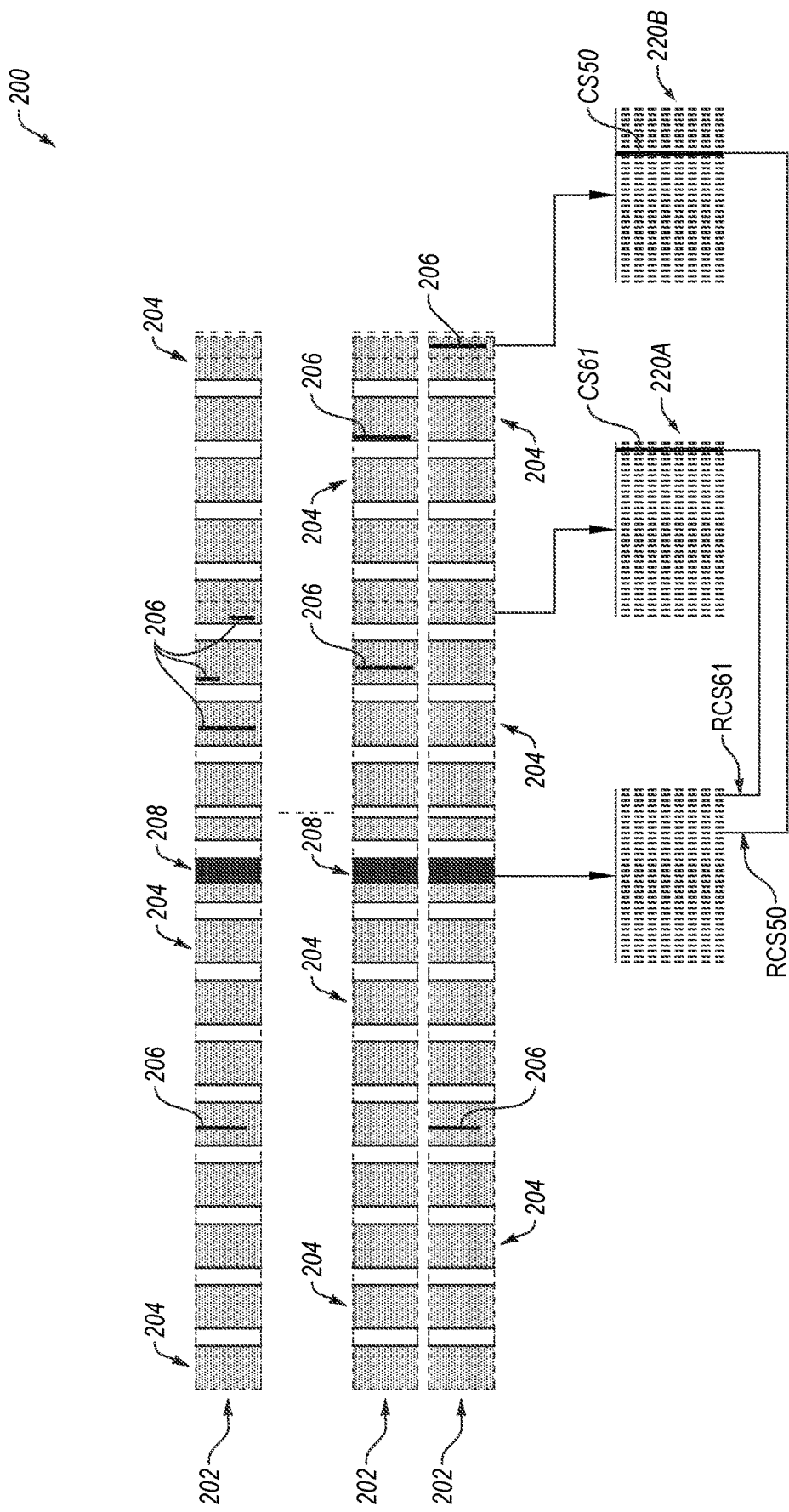
FIG. 2 depicts an example memory device including a portion of a memory array.

FIG. 2 depicts an example device including a portion of a memory array 200. Memory array 200 includes groups (e.g., also referred to herein as "rows") 202 of memory cells, wherein each group 202 includes a number of memory mats 204. As will be appreciated, each memory mat 204 may include a number (e.g., two) of column planes. In other words, each memory mat 204 may include a number (e.g., two) of sub-mats. Further, each column plane includes a number of column select (CS) lines 206 for accessing memory cells at column addresses within each column plane. For example only, each column plane may include 64 CS lines. For example, one or more sense amplifiers (not depicted in FIG. 2) may be positioned between adjacent memory mats of a row 202. Further, for example, one or more sub-word line drivers (not depicted in FIG. 2) may be positioned between adjacent memory mats of different rows 202.

Moreover, each row 202 includes a number of redundant memory cells accessible via redundant column select (RCS) lines. For example, if one or more memory cells accessible via a column select line X of a column plane of a row 202 fails, the one or more memory cells accessible via column select line X may be replaced with one or more memory cells accessible via a column select address X of redundant column plane 208. Similarly, if one or more memory cells accessible via column select line Y of a column plane of a row 202 fails, the one or more memory cells accessible via column select line Y of the column plane may be replaced with one or more memory cells accessible via a column select address Y of redundant column plane 208.

As will be appreciated, in conventional devices, if memory cells accessible via different CS lines of a single column plane of a row 202 fail, the different CS lines of the single column plane may be replaced via associated column select lines of redundant column plane 208. Further, if a memory cell accessible via a first column select line (e.g., CS line A) of a column plane fails, and a memory cell accessible via a second (i.e., different) column select line (e.g., CS line B) of a second (i.e., different) column plane fails, the first column select line (e.g., CS line A) of the column plane may be replaced via an associated column select line (e.g., CS line A) of redundant column plane 208 and the second column select line (e.g., CS line B) of the second column plane may be replaced via an associated column select line (e.g., CS line B) of redundant column plane 208. More specifically, if one or more memory cells accessible via column select line 61 (CS61) of a column plane 220A fail, and one or more memory cells accessible via a column select line 50 (CS50) of a second (i.e., different) column plane 220B fail, column select line 61 (CS61) of column plane 220A may be replaced via column select line 61 (RCS61) of redundant column plane 208 and column select line 50 (CS50) of column plane 220B may be replaced via column select line 50 (RCS50) of redundant column plane 208.

However, in conventional devices, it may not be possible to replace more than one column select line (i.e., in different memory column planes) that correspond to the same column address. For example, if two columns, which correspond to the same column address, fail, it may not be possible to replace both columns. More specifically, if one or more memory cells accessible via a first column select line (e.g., CS line A) of a first column plane fail, and one or more memory cells accessible via the same column select line (e.g., CS line A) of a second (i.e., different) column plane fail, only one of the column select lines may be replaced. In other words, if one or more memory cells accessible via CS61 of column plane 220A fail, and memory cells accessible via CS61 of column plane 220B fail, it may not be possible to replace both column select lines (i.e., CS61 in column plane 220A and CS61 in column plane 220B).

Figure 3:
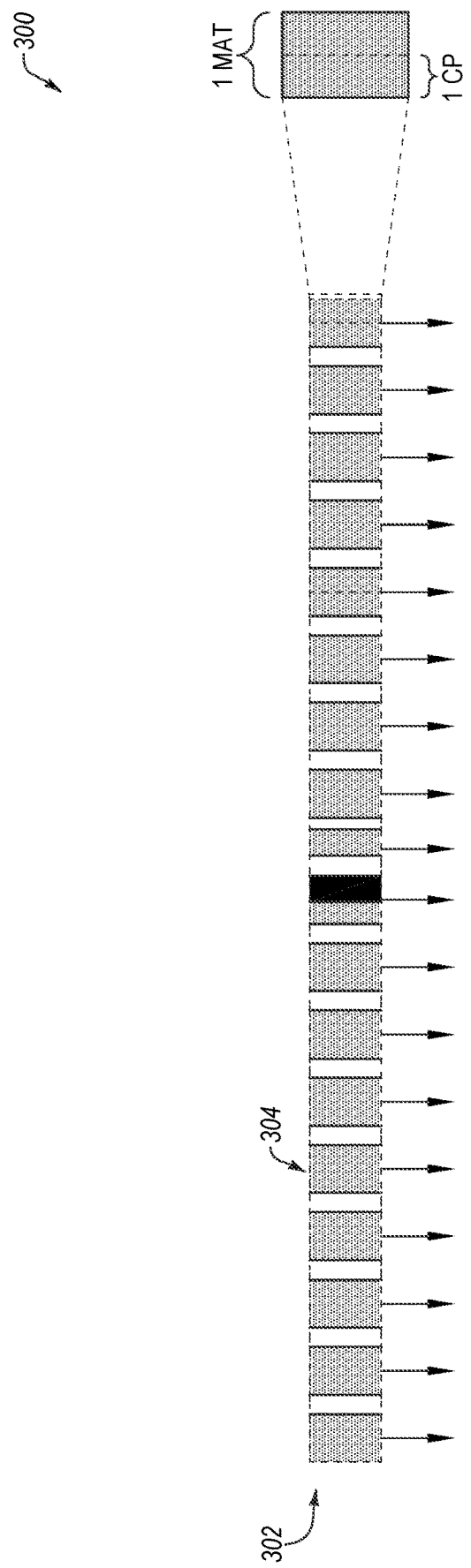
FIG. 3 depicts a number of memory mats of an example memory array.

FIG. 3 illustrates a number of memory mats of an example memory array 300. More specifically, memory array 300 includes a group (e.g., a "row") 302 of memory mats 304. Each memory mat includes two (2) column planes (i.e., two sub-mats). In conventional systems and/or devices, each column plane is tested sequentially (i.e., one by one) to detect failed column planes, if any. More specifically, during testing, for each column address, one bit for each column plane is generated (e.g., sequentially), and based on the generated bit (e.g., output from a column plane), it may be determined whether or not the column plane is defective (i.e., whether the column plane includes one or more defective memory cells) for a specific column address. As will be appreciated, in at least some examples, to test each column plane of a row of memory mats (i.e., including 35 column planes) for a specific column address, 35 bits of data is read out from the row (e.g., 35 bits of data is read out from a memory device). Thus, it will appreciated that conventional systems and methods for detecting defective column planes are time consuming and resource intensive.

Figure 4:
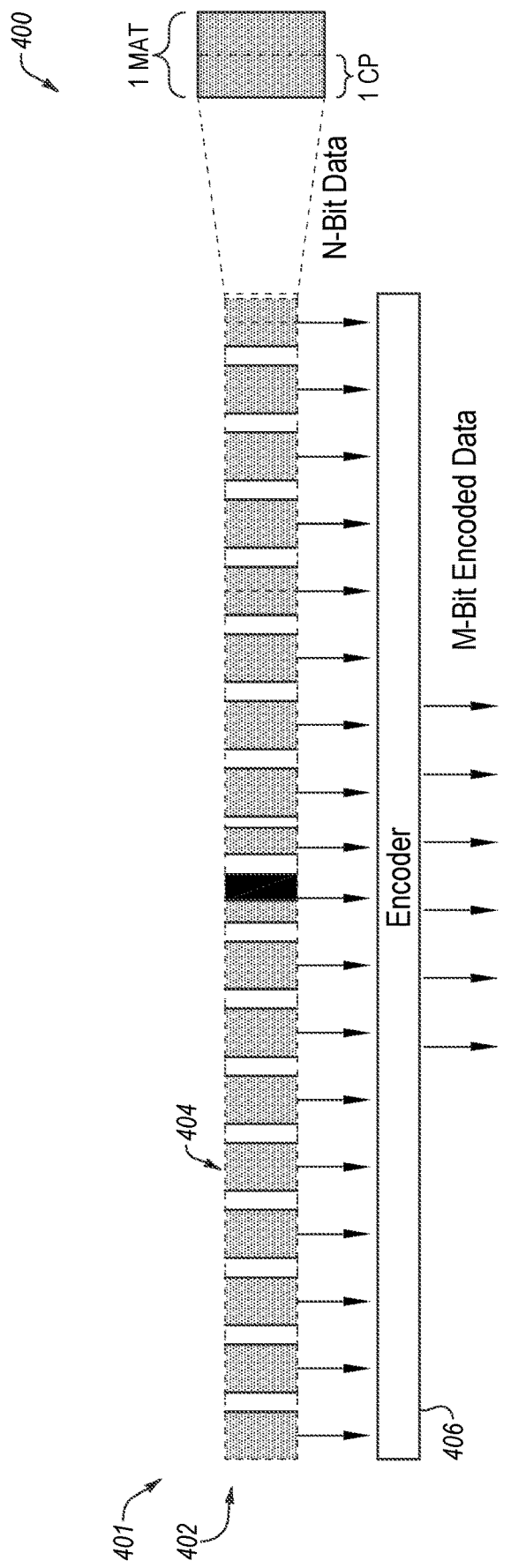
FIG. 4 depicts a device including a number of memory mats of a memory array coupled to an encoder, in accordance with various embodiments of the present disclosure.

FIG. 4 depicts a device 400 including a number of memory mats of a memory array 401 coupled to an encoder 406, according to various embodiments of the present disclosure. Device 400 may include and/or may be part of a memory device, such as memory device 100 of FIG. 1. Memory array 401 may be part of a memory bank (e.g., one of the eight memory banks BANK0-7 shown in FIG. 1). Memory array 401 includes a group (e.g., a "row") 402 of memory mats 404, wherein each memory mat 404 includes a number (e.g., two) of column planes (also referred to herein as "sub-mats"). Device 400 further includes encoder 406 coupled to and configured to receive data from each memory mat 404 of row 402. More specifically, encoder 406, which may include one or more circuits, is configured to receive (e.g., substantially simultaneously receive) a first number of bits (e.g., N bits) from row 402, encode (e.g., substantially simultaneously encode) the first number of bits, and output (e.g., substantially simultaneously output) a second number of bits (e.g., M bits), wherein the second number of bits is less than the first number of bits (e.g., M<N). As a more specific example, encoder 406 is configured to receive 8 bits from each column plane of row 402 (i.e., 280 bits (i.e., 35*8) from row 402) and output 6 bits (e.g., 6-bit encoded data). As a non-limiting example, encoder 406 may be positioned within a peripheral circuit region of a memory device (e.g., memory device 100 of FIG. 1). Further, in some examples, a number of data amplifiers (not shown in FIG. 4) may be positioned between a memory array (e.g., including row 402) and encoder 406. For example, encoder 406 may be part of, or may be coupled to, an input/output circuit, such as input/output circuit 162 of memory device 100 of FIG. 1.

Yet more specifically, during a contemplated testing operation of device 400, for each column address, each column plane may generate 8 bits, and thus in this example including 35 column planes (i.e., 17.5 memory mats), 280 (i.e., 35*8) bits are generated and received (e.g., simultaneously received) at encoder 406. As a non-limiting example, if each bit generated via a column plane has a first state (e.g., a "0"), the column plane "passes" the test (i.e., the column plane does not include any defective memory cells), and if the column plane generates one or more bits having a second state (e.g., a "1"), the column plane "fails" the test (i.e., the column plane includes one or defective memory cells).

Continuing with the contemplated testing operation, if, for a specific column address, more than one column plane generates a bit having the second state (i.e., more than one column plane fails the test), encoder 406 generates an M-bit output indicating that more than one column plane has failed. More specifically, for example, if, for a specific column address, more than one column plane generates a bit having the second state (i.e., more than one column plane fails the test), encoder 406 may generate an M-bit output (also referred to herein as a "result" or a "signal"), such as "110XXX," indicating that more than one column plane fails the test.

Further, if each bit generated by each column plane has the first state (i.e., each column plane passed the test), encoder 406 generates an M-bit output indicating that each column plane passed the test. More specifically, for example, if each bit generated by each column plane of row 402 has the first state (i.e., each column plane passed the test), encoder 406 may generate an M-bit output (also referred to herein as a "result" or a "signal"), such as "111XXX," indicating that no column planes have failed the test.

Moreover, if, for a specific column address, only one column plane generates a bit having the second state (i.e., one column plane failed the test), encoder 406 generates an M-bit output indicating which one column plane failed the test. More specifically, if one column plane fails the test, encoder 406 may generate an M-bit value (e.g., between "000000" and "100010" (i.e., between 0-34)) indicating which column plane (e.g., an address of the column plane) failed the test. As a more specific example, if column plane 0 (e.g., the first column plane in row 402) is the only column plane of row 402 to generate a bit having the second state (i.e., "1"), encoder 406 generates "000000" (i.e., binary value for "0" identifying column plane 0). As another example, if column plane 9 (e.g., the tenth column plane in row 402) is the only column plane of row 402 to generate a bit having the second state (i.e., "1"), encoder 406 generates "001001" (i.e., binary value for "9" identifying column plane 9). As yet another example, if column plane 33 (e.g., the 34$^{th}$ column plane in row 402) is the only column plane of row 402 to generate a bit having the second state (i.e., "1"), encoder 406 generates "100001" (i.e., binary value for "33" identifying column plane 33). Further, in this example, the M-bit value (e.g., between "000000" and "100010") (i.e., that identifies which column plane failed the test) and the specific column address may be used in a repair process (e.g., to repair a column select line in the failed column plane).

Figure 5:
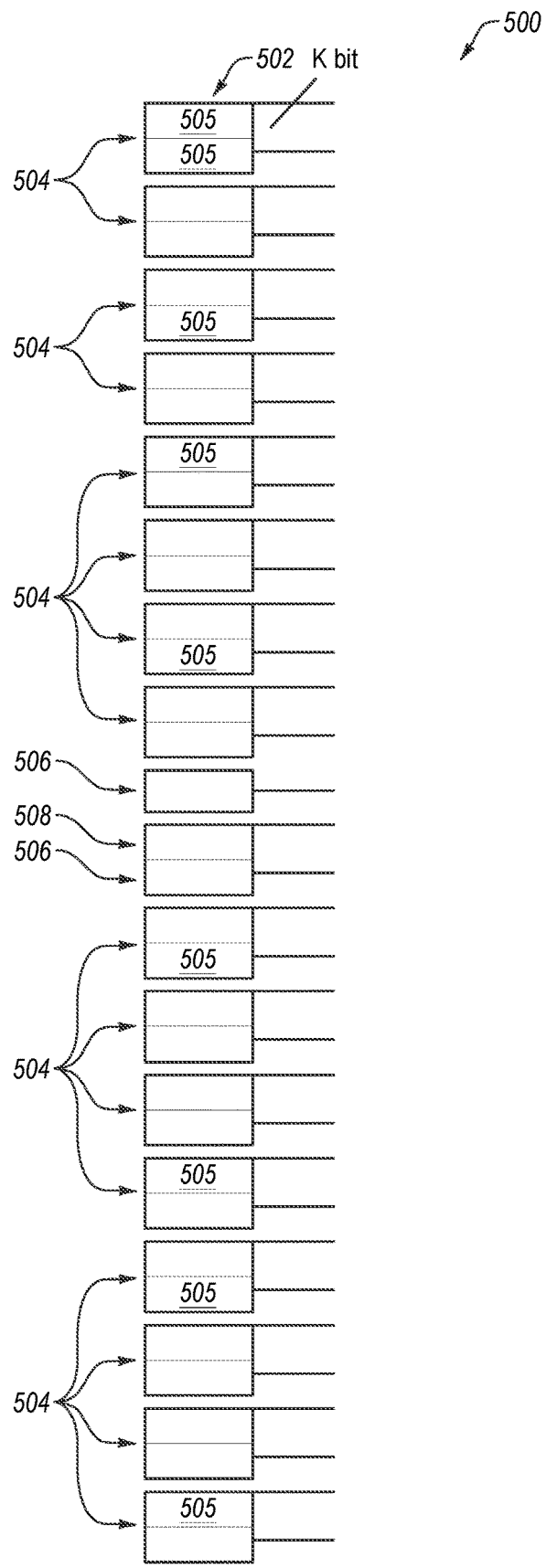
FIG. 5 is another illustration of a number of memory mats of an example memory array, according to various embodiments of the present disclosure

FIG. 5 is another illustration of a memory array 500 including a group (e.g., a "row") 502 of memory mats 504, in accordance with various embodiments of the present disclosure. For example, row 402 of FIG. 4 may include row 502. In this example, each memory mat 504 includes two column planes 505. Further, row 502 includes error correcting code (ECC) units 506 and redundancy unit 508. Each column plane 505, each ECC unit 506, and redundancy unit 508 is configured to output a number of bits (e.g., K bits (e.g., 8 bits)). As will be appreciated, ECC units 506 may be used for correcting an error associated with row, and redundancy unit 508 may include redundancy memory cells.

For example, each column plane 505 of row 502 may be coupled to input/output (I/O) circuitry (e.g. I/O circuit 162 of FIG. 1), such as an input/output (DQ) pads (also referred to herein as "data pads"). Thus, in some example, each column plane 505 of row 502 may be configured to read or write 2*K bits (e.g., 2*8 bits) for one column operation.

Figure 6A:
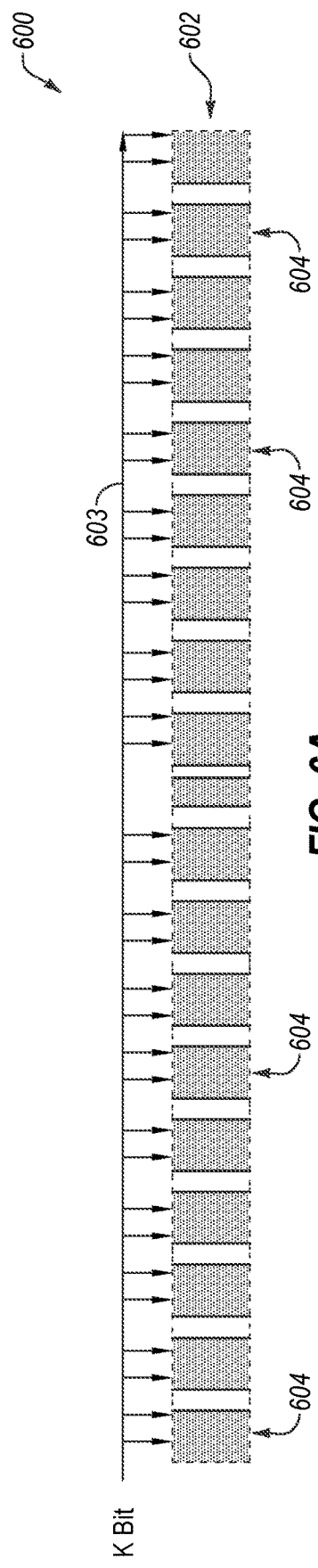
FIG. 6A depicts an example device including a number of memory mats coupled to a bus, according to various embodiments of the present disclosure.

FIG. 6A illustrates a device 600 including a group (e.g., a "row") 602 of memory mats 604, in accordance with various embodiments of the present disclosure. Device 600 may include and/or may be part of a memory device, such as memory device 100 of FIG. 1. For example, device 400 of FIG. 4 may include device 600. For example, row 602 may be part of a memory bank (e.g., one of the eight memory banks BANK0-7 shown in FIG. 1).

During a testing operation, for a specific column address, a number of bits (e.g., 8 bits) may be written to each column plane of row 602 via a bus 603. Thus, in this example, 280 bits (i.e., 35*8) may be written to row 602. Further, a number of bits (e.g., 8 bits) may be read from each column plane of row 602. Thus, in this example, 280 bits (i.e., 35*8) may be read from row 602. Further, the bits written to each column plane of row 602 may be compared to the bits read from each column plane to detect defective column planes for the specific column address, if any.

Figure 6B:
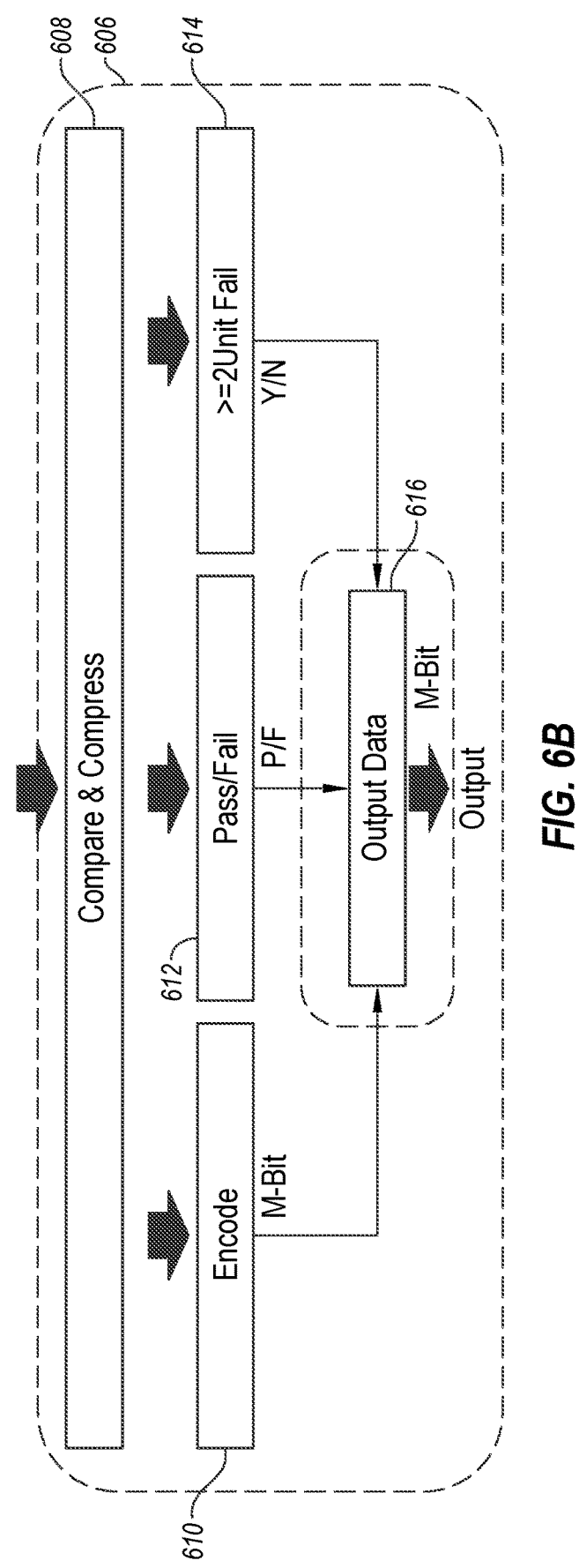
FIG. 6B depicts an example device including a number of memory mats coupled to an encoder for generating encoded data, in accordance with various embodiments of the present disclosure.

FIG. 6B illustrates device 600 including row 602 coupled to an encoder 606, according to various embodiments of the disclosure. In this illustration, encoder 606, which may include encoder 406 of FIG. 4, includes a compare and compress module 608, an encode module 610, a pass/fail module 612, fail detector module 614, and an output module 616. For example, encoder 606 may be part of, or may be coupled to, an input/output circuit, such as input/output circuit 162 of memory device 100 of FIG. 1.

As noted above with reference to FIG. 6A, during a contemplated testing operation, for a specific column address, a number of bits (e.g., 8 bits) may be written to each column plane of row 602. More specifically, in one example, 8 bits, each having a high state (e.g., 1) may be written to the specific column address for each column plane of row 602. Subsequently, 8 bits may be read from the specific column address for each column plane of row 602, and the read bits may be compared to the written bits (i.e. via compare and compress module 608), and a compressed result is generated (i.e. via compare and compress module 608). More specifically, if each of the 8 read bits match the 8 written bits, compare and compress module 608 may generate a bit having a first state (e.g., "0") for the specific column address of the associated column plane (i.e., indicating that the column plane passed the test for the specific column address). On the other hand, if at least one of the 8 read bits does not match the 8 written bits, compare and compress module 608 may generate a bit having a second state (e.g., "1") for the specific column address of the associated column plane (i.e., indicating that the column plane failed the test for the specific column address). Thus, as will be appreciated, compare and compress module 608 may generate an N-bit output (e.g., a 35 bit output), wherein a state of each bit of the output is indicative of whether or not an associated column plane passed or failed the test for the specific column address.

Continuing with this example, the N-bit output is conveyed to encode module 610, pass/fail module 612, and fail detector module 614. Encode module 610 may be configured to receive the N-bit output and generate an encoded M-bit output, wherein a value of M is less than a value of N. More specifically, for example, encode module 610 may generate a 6-bit output in response to receiving a 35-bit input. Similar to the process described above with reference to FIG. 4, an encoded M-bit output may identify a column plane number (e.g., column plane address) that failed the test. As an example, if column plane 25 (e.g., the 26$^{th}$ column plane in row 602) failed the test (i.e., for a specific column address), encode module 610 may generate "011001" (i.e., binary value for "25" identifying column plane 25). It will be appreciated that if more than one column plane failed the test (i.e., for the specific column address), the M-bit output of encode module 610 may not indicate that more than one column plane failed the test (e.g., the M-bit output may only identify one column plane). More specifically, for example, if column planes 25 and 27 both failed the test (i.e., for the specific column address), the M-bit output of encode module 610 may be one of two possible values (e.g., either "011001" (i.e., binary value for "25" identifying column plane 25) or "011011" (i.e., binary value for "27" identifying column plane 27)).

Pass/fail module 612 may be also be configured to receive the N-bit output. If the N-bit output indicates that each column plane of row 602 passed the test (i.e., for the specific column address), pass/fail module 612 may generate an M-bit output (also referred to herein as a "result" or a "signal") such as "111XXX". Otherwise, pass/fail module 612 may not generate an output, may generate a NULL output, or may generate another output indicating that at least one column plane failed the test.

Figure 7:
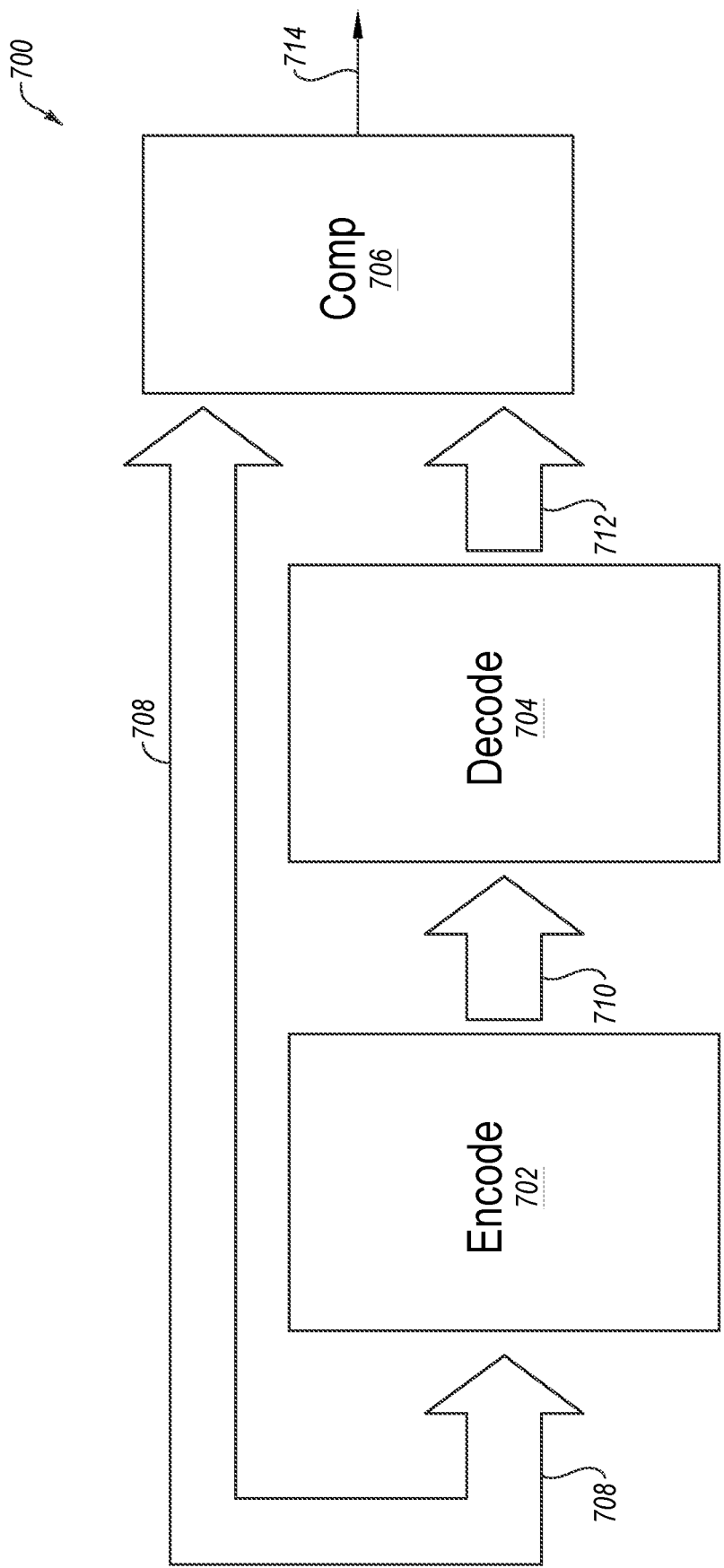
FIG. 7 depicts an example fail detector module, in accordance with various embodiments of the present disclosure.

Fail detector module 614 may be also be configured to receive the N-bit output. FIG. 7 illustrates an example fail detector module 700, according to one or more embodiments of the present disclosure. For example, fail detector module 614 of FIG. 6B may include fail detector module 700.

With reference to FIG. 7, fail detector module 700 is configured to receive N-bit output 708 at an encode module 702 and a comparator module 706. Encode module 702, which may function the same as or similar to encode module 610 of FIG. 6B, may receive N-bit output 708 and generate an encoded M-bit output 710, wherein M is less than N. Encoded M-bit output 710 may identify a column plane number that failed the test (e.g., between "000000" and "100010"). As noted above, even if N-bit output 708 indicates that more than one column plane has failed the test, M-bit output 710 may identify only one of the column planes that failed the test.

Continuing with this example, a decode module 704 may receive M-bit output 710 and generate an N-bit output 712, which may be compared to N-bit output 708 via comparator module 706. As noted above, if more than one column plane failed the test, M-bit output 710 may only indicate a single column plane address, and therefore, N-bit output 712 may only indicate that a single column plane failed the test. Thus, if more than one column plane failed the test, N-bit output 708 may indicate that more than one column plane failed the test, and N-bit output 712 will not be equal to N-bit output 708. Thus, in this example, comparator module 706 may generate an M-bit output 714 (also referred to herein as a "result" or a "signal"), such as "110XXX". On the other hand, if only one column plane failed the test, N-bit output 712 will be equal to N-bit output 708 and comparator module 706, for example, may not generate an output, may generate a NULL output, or may generate another output indicating that no more than one column plane failed the test.

Figure 8:
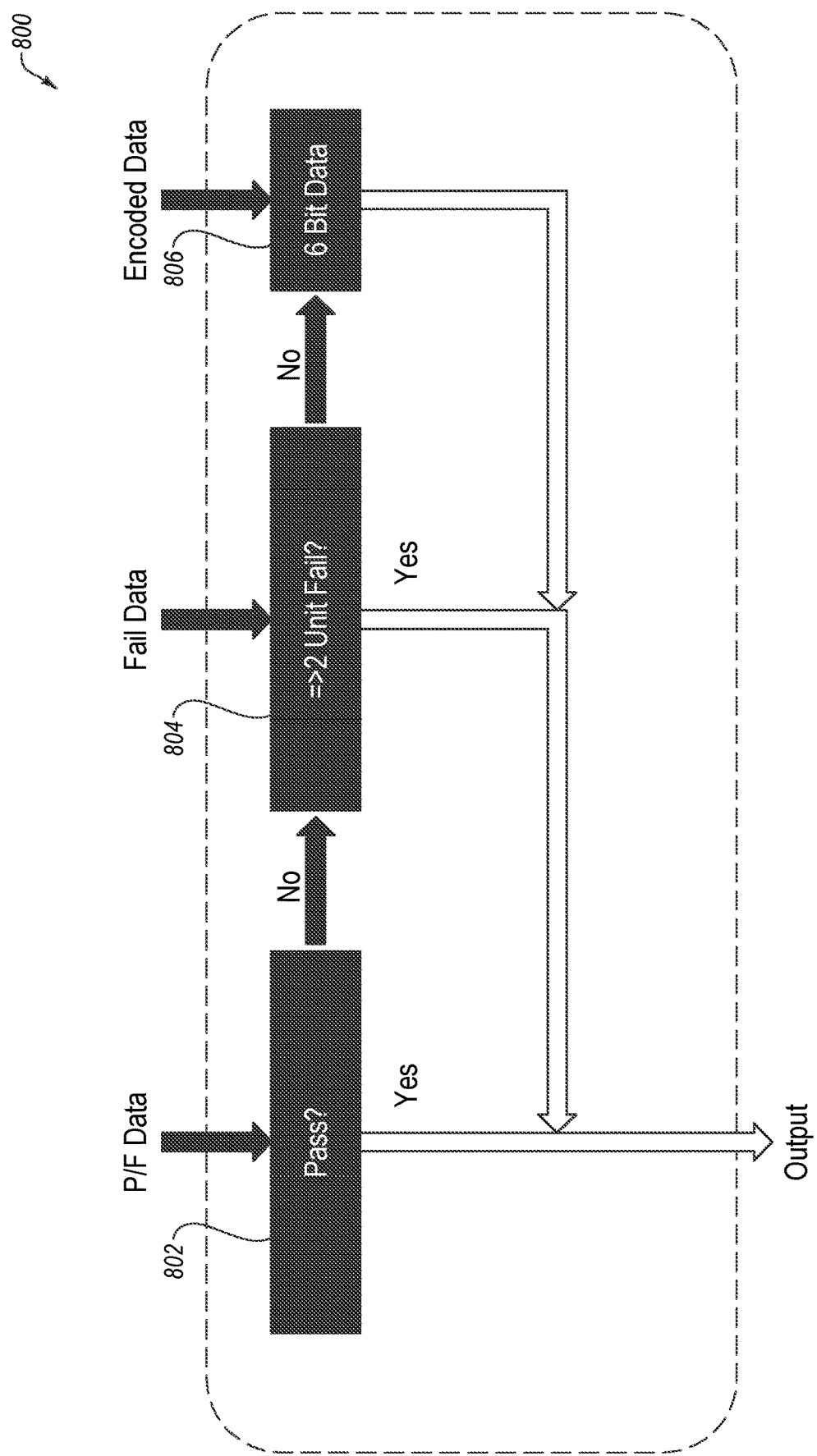
FIG. 8 is a diagram of an example flow that may be used to test a memory device, according to various embodiments of the present disclosure.

FIG. 8 is a diagram of an example flow 800 that may be used to test a memory device, according to at least one embodiment described herein. In some embodiments, at least a portion of flow 800 may be an example of an operation of device 600 of FIG. 6B (e.g., output module 616 of device 600). Flow 800 may begin at block 802, wherein a signal is received from pass/fail module 612 (see FIG. 6B). If the signal received from pass/fail module 612 indicates that each column plane passed a test (i.e., for a specific column address), output module 616 may generate an M-bit output (e.g., "111XXX"). Otherwise, if the signal received from pass/fail module 612 indicates at least one column plane failed the test, flow 800 may proceed to block 804, wherein a signal is received from fail detector module 614 (see FIG. 6B). If the signal received from fail detector module 614 indicates that more than one column plane failed the test (i.e., for the specific column address), output module 616 may generate a different M-bit output (e.g., "110XXX"). Otherwise, if the signal received from fail detector module 614 indicates that only one column plane failed the test (i.e., for the specific column address), flow 800 may proceed to block 806, wherein a signal (e.g., an M-bit output identifying a number (e.g., an address) of the column plane that failed the test), which is received from encode module 610, is conveyed as the output (e.g., of output module 616).

Figure 9:
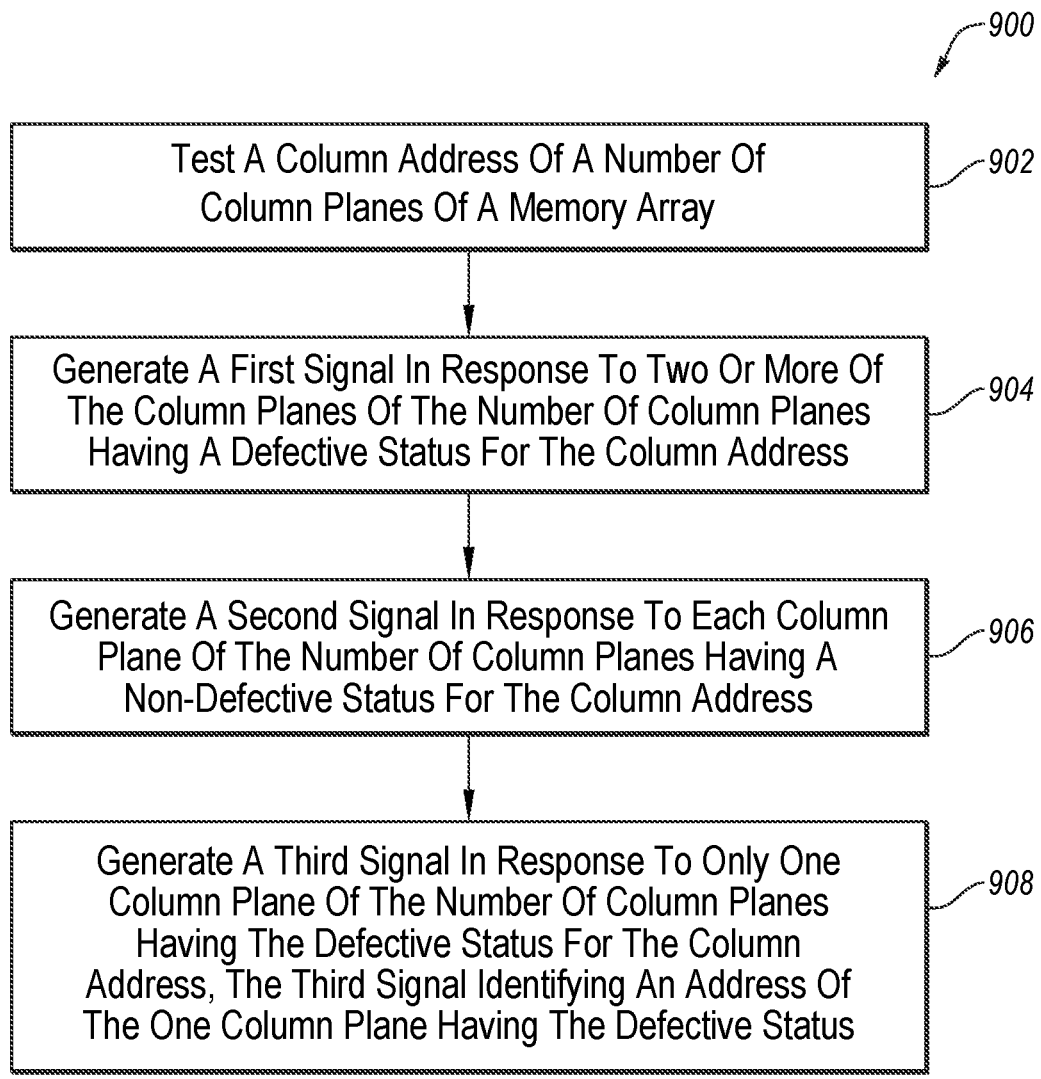
FIG. 9 is a flowchart of an example method of testing a memory device, in accordance with various embodiments of the present disclosure.

FIG. 9 is a flowchart of an example method 900 of testing a memory device, in accordance with various embodiments of the disclosure. Method 900 may be arranged in accordance with at least one embodiment described in the present disclosure. Method 900 may be performed, in some embodiments, by a device or system, such as memory device 100 of FIG. 1, device 400 of FIG. 4, device 600 of FIGS. 6A and 6B, fail detector module 700 of FIG. 7, a memory system 1000 of FIG. 10, and/or an electronic system 1100 of FIG. 11, or another device or system. Although illustrated as discrete blocks, various blocks may be divided into additional blocks, combined into fewer blocks, or eliminated, depending on the desired implementation.

Method 900 may begin at block 902, wherein a column address for a number of column planes of a memory device may be tested, and method 900 may proceed to block 904. For example, for a first column address of a number of column address, the number of column planes may be written to (e.g., via bus 603 of FIG. 6A). Further, data may be read from the number of column planes, and the write data may be compared (e.g., via encoder 606 of FIG. 6B) to the read data to determine a status (e.g., defective or non-defective) of each of the column planes.

At block 904, a first signal may be generated in response to two or more of the column planes of the number of column planes having a defective status for the column address, and method 900 may proceed to block 906. For example, if two or more column planes are determined to be defective (e.g., based on the test performed at block 902), a device (e.g., encoder 606 of FIG. 6B) may generate an M-bit signal (e.g., 110XXX).

At block 906, a second signal may be generated in response to each of the column planes of the number of column planes having a non-defective status, and method 900 may proceed to block 908. For example, if each of the column planes are determined to be non-defective (e.g., based on the test performed at block 902), a device (e.g., encoder 606 of FIG. 6B) may generate an M-bit signal (e.g., 111XXX).

At block 908, a third signal may be generated in response to only one column plane of the number of column planes having the defective status for the column address. For example, if only one column plane is determined to be defective (e.g., based on the test performed at block 902), a device (e.g., encoder 606 of FIG. 6B) may generate an M-bit signal that identifies the one column plane that is defective. More specifically, for example, if column plane 25 is the only column plane having a defective status, the device may generate "011001", which is the binary value for "25".

Modifications, additions, or omissions may be made to method 900 without departing from the scope of the present disclosure. For example, the operations of method 900 may be implemented in differing order. For example, the act at block 906 may occur before that act of block 904. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein test data, comprising one bit (e.g., indicating a defective or non-defective status) for each column plane of the number of column planes, may be generated. As another example, a method may include one or more acts wherein the first signal, the second signal, and/or the third signal may be conveyed to test/repair circuitry (e.g. either on the memory device or external to the memory device). Further, for example, a method may include one or more acts wherein one or more column select lines of a column plane may be replaced with redundant column lines of a redundant column plane of the memory device.

It is noted that various operations described herein may be performed for each column address of a memory array. Thus, for example, although each column plane of a group of memory mats may pass a test for a first column address (or the first column address may be replaced for one column plane that failed the test), more than two columns plane may fail a test for a second, different column address. It is further noted that, in some cases, two or more column planes may fail if a defect exists in an associated row section of a memory array. In this case, it may be possible to repair the defect via replacing the defected row section. In other words, even if two or more column planes of a memory device fail a test for a specific column address, the memory device may not necessarily be characterized as a "fail device" or a "fail chip." Rather, in some cases, additional testing may be necessary. For example, to detect if there are one or more defects in a row section, testing may be performed on additional (e.g., most or all) column address for the row section.

As will be appreciated, reading and encoding (e.g., substantially simultaneously reading and/or substantially simultaneously encoding) test data may speed up a process of testing a memory device (e.g., compared to conventional methods of sequentially testing column planes). Reduced test times may allow for a greater number of devices to be tested within a time frame, thus possibly lowering the cost of testing and repair of devices (e.g., DRAM devices).

Figure 10:
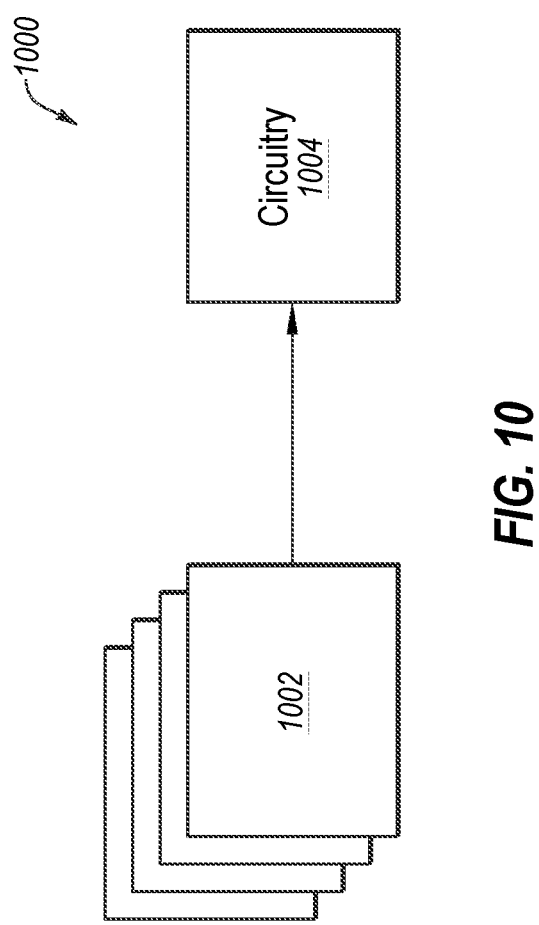
FIG. 10 is a simplified block diagram of a memory system, in accordance with various embodiments of the present disclosure.

A memory system is also disclosed. According to various embodiments, the memory system may include a memory device (e.g., memory device 100 of FIG. 1) including one or more memory cell arrays. FIG. 10 is a simplified block diagram of a memory system 1000 implemented according to one or more embodiments described herein. Memory system 1000, which may include, for example, a semiconductor device, includes a memory array 1002 and circuitry 1004, which may include, for example only, an encoder (e.g., encoder 406 of FIG. 4 or encoder 606 of FIG. 6B), as described herein. Memory array 1002, which may include a number of memory banks, may include a number of memory cells. Circuitry 1004, may be operatively coupled with memory array 1002, may be configured for carrying out one or more embodiments disclosed herein. Memory system 1000 may also include a controller (not shown in FIG. 10) coupled to memory array 1002 and/or circuitry 1004.

An electronic system is also disclosed. According to various embodiments, the electronic system may include a memory device including a number of memory dies, each memory die having an array of memory cells. Each memory cell may include an access transistor and a storage element operably coupled with the access transistor.

FIG. 11 is a simplified block diagram of an electronic system 1100 implemented according to one or more embodiments described herein. Electronic system 1100 includes at least one input device 1102, which may include, for example, a keyboard, a mouse, or a touch screen. Electronic system 1100 further includes at least one output device 1104, such as a monitor, a touch screen, or a speaker. Input device 1102 and output device 1104 are not necessarily separable from one another. Electronic system 1100 further includes a storage device 1106. Input device 1102, output device 1104, and storage device 1106 may be coupled to a processor 1108. Electronic system 1100 further includes a memory system 1110 coupled to processor 1108. Memory system 1110 which may include memory system 1000 of FIG. 10. Electronic system 1100 may include, for example, a computing, processing, industrial, or consumer product. For example, without limitation, electronic system 1100 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the present disclosure may include a device. The device may include a memory array including a number of column planes. The device may also include at least one circuit coupled to the memory array. The at least one circuit may be configured to generate test result data for a column address for each column plane of the number of column planes of the memory array. The test result data may identify whether or not each column plane of the number of column planes failed a test for the column address. The at least one circuit may also be configured convert the test result data to a first result responsive to two or more of the column planes failing the test for the column address. Also, the at least one circuit may be configured to convert the test result data to a second result responsive to no column planes failing the test for the column address. Further, the at least one circuit may be configured to convert the test result data to a third result responsive to one column plane failing the test for the column address, wherein the third result may identify the one column plane.

According to another embodiment of the present disclosure, a method of testing a memory device may include testing a column address of a number of column planes of a memory array. The method may also include generating a first signal in response to two or more column planes of the number of column planes having a defective status for the column address. The method may further include generating a second signal in response to each column plane of the number of column planes having a non-defective status for the column address. Moreover, the method may include generating a third signal in response to only one column plane of the number of column planes having the defective status for the column address. The third signal may identify an address of the one column plane having the defective status.

Additional embodiments of the present disclosure include a system. The system may include at least one input device, at least one output device, and at least one processor device operably coupled to the input device and the output device. The system may also include at least one memory device operably coupled to the at least one processor device and comprising circuitry. The circuitry may be configured to write data to each column plane of N column planes of the at least one memory device. The circuitry may also be configured to read data from each column plane of the N column planes. Further, the circuitry may be configured to compare the write data to the read data to generate N-bit test data, wherein each bit of the N-bit test data may identify whether or not an associated column plane of the N column planes is defective. The circuitry may further be configured to convert the N-bit test data to a first M-bit result responsive to no column planes of the N column planes being defective, wherein a value of N is greater than a value of M. Also, the circuitry may be configured to convert the N-bit test data to a second, different M-bit result responsive to two or more column planes of the N column planes being defective. In addition, the circuitry may be configured to convert the N-bit test data to a third, different M-bit result responsive to one column lane being defective.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
   a memory array including a number of column planes;
   at least one circuit coupled to the memory array and configured to:
      generate test result data for a column address for each column plane of the number of column planes of the memory array, the test result data identifying whether or not each column plane of the number of column planes failed a test for the column address;
      convert the test result data to a first result responsive to two or more of the column planes failing the test for the column address;
      convert the test result data to a second result responsive to no column planes failing the test for the column address; and
      convert the test result data to a third result responsive to one column plane failing the test for the column address, the third result identifying the one column plane.

2. The device of claim 1, wherein the test result data comprises either 280 bits or 35 bits, and each of the first result, the second result, and third result comprise 6 bits.

3. The device of claim 1, wherein the at least one circuit comprises:
   an encode module configured to receive the test result data and generate the third result;
   a pass/fail module configured to receive the test result data and generate the second result; and
   a fail detector module configured to receive the test result data and generate the first result.

4. The device of claim 3, wherein the fail detector module comprises:
   an encode module configured to receive the test result data and generate encoded data;
   a decode module configured to receive the encoded data and generate decoded data; and
   a compare module configure to:
      receive the test result data and the decoded data; and
      generate the first result responsive to the test result data not matching the decoded data.

5. The device of claim 1, wherein the at least one circuit is further configured to:
   generate encoded data based on the test result data;
   generate decoded data based on the encoded data; and
   generate the first result responsive to the test result data not matching the decoded data.

6. The device of claim 1, wherein the third result comprises a binary number identifying an address of the one column plane.

7. The device of claim 1, wherein the at least one circuit is further configured to convert a number of bits indicative of whether one or more memory cells of the column address is defective into one bit indicative of whether or not a column plane of the number of column planes failed the test, wherein the test result data for the column plane comprises the one bit.

8. A method, comprising:
   testing a column address of a number of column planes of a memory array;
   generating a first signal in response to each column plane of the number of column planes having a non-defective status for the column address;

generating a second signal in response to two or more column planes of the number of column planes having a defective status for the column address; and generating a third signal in response to only one column plane of the number of column planes having the defective status for the column address, the third signal identifying an address of the one column plane having the defective status.

9. The method of claim 8, further comprising generating test data comprising one bit for each column plane of the number of column planes, the one bit having either a first state indicative of the defective status or a second state indicative of the non-defective status.

10. The method of claim 9, wherein generating the second signal comprises generating the second signal in response to two or more bits of the test data having the first state.

11. The method of claim 9, wherein generating the first signal comprises generating the first signal in response to each bit of the test data having the second state.

12. The method of claim 9, wherein generating the third signal comprises generating the third signal in response to only one bit of the test data having the first state.

13. The method of claim 9, wherein generating the second signal comprises:
generating encoded data based on the test data;
generating decoded data based on the encoded data;
comparing the test data and the decoded data; and
generating the second signal responsive to the test data being different from the decoded data.

14. The method of claim 8, wherein testing comprises:
writing first data to the column address of the number of column planes;
reading second data from the column address of the number of column planes; and
comparing the first data to the second data to generate test data for each column plane, wherein the test data comprises one or more bits for each column plane, the one or more bits indicative of either the non-defective status or the defective status.

15. A system, comprising:
at least one input device;
at least one output device;
at least one processor device operably coupled to the input device and the output device; and
at least one memory device operably coupled to the at least one processor device and comprising:
circuitry configured to:
write data to each column plane of N column planes of the at least one memory device;
read data from each column plane of the N column planes;
compare the write data to the read data to generate N-bit test data, each bit of the N-bit test data identifying whether or not an associated column plane of the N column planes is defective;
convert the N-bit test data to a first M-bit result responsive to no column planes of the N column planes being defective, wherein a value of N is greater than a value of M;
convert the N-bit test data to a second, different M-bit result responsive to two or more column planes of the N column planes being defective; and
convert the N-bit test data to a third, different M-bit result responsive to one column plane being defective.

16. The system of claim 15, wherein a value of N is either 35 or 280, and a value of M is 6.

17. The system of claim 15, wherein the circuitry comprises:
a compare module configured to compare the write data to the read data to generate the N-bit test data;
a pass/fail module coupled to an output of the compare module and configured to receive the N-bit test data and generate the first M-bit result;
a fail detector module coupled to the output of the compare module and configured to receive the N-bit test data and generate the second, different M-bit result; and
an encode module coupled to an output of the compare module and configured to receive the N-bit test data and generate the third, different M-bit result.

18. The system of claim 17, wherein the circuitry further comprises an output module configured to receive the first M-bit result, the second, different M-bit result, the third, different M-bit result, or any combination thereof.

19. The system of claim 15, wherein the circuitry is further configured to:
generate an encoded signal based on the N-bit test data;
generate a decoded signal based on the encoded signal;
compare the N-bit test data to the decoded signal; and
generate the second, different M-bit result responsive to the N-bit test data not matching the decoded signal.

20. The system of claim 15, wherein the third, different M-bit result comprises a binary number identifying a number of the one defective column plane.

* * * * *